United States Patent [19]
Ju et al.

[11] Patent Number: 6,081,218
[45] Date of Patent: Jun. 27, 2000

[54] FIVE-LEVEL SWITCHED-CAPACITOR DAC, METHOD OF OPERATION THEREOF AND SIGMA-DELTA CONVERTER EMPLOYING THE SAME

[75] Inventors: Peicheng Ju, Summit; Krishnaswamy Nagaraj, Somerville, both of N.J.

[73] Assignee: Lucent Technologies, Inc., Murray Hill, N.J.

[21] Appl. No.: 09/016,613

[22] Filed: Jan. 30, 1998

[51] Int. Cl.⁷ ............................. H03M 1/66; H03M 3/00
[52] U.S. Cl. ........................................... 341/150; 341/143
[58] Field of Search ................................... 341/150, 144, 341/155, 138, 143, 118

[56] References Cited

U.S. PATENT DOCUMENTS

| | | | |
|---|---|---|---|
| 5,376,936 | 12/1994 | Kerth et al. | 341/150 |
| 5,563,957 | 10/1996 | McCartney | 341/150 |
| 5,739,781 | 4/1998 | Kagey | 341/155 |
| 5,818,377 | 10/1998 | Wieser | 341/144 |
| 5,889,485 | 3/1999 | Schneider | 341/150 |

OTHER PUBLICATIONS

Article entitled "A 22–kHz Multibit Switched–Capacitor Sigma–Delta D/A Converter With 92 dB Dynamic Range" by Peicheng Ju, Ken Suyama, Paul F. Ferguson, Jr., Wai Lee; 1995 IEEE Journal of Solid State Circuits, vol. 30.

*Primary Examiner*—Brian Young
*Assistant Examiner*—Patrick Wamsley

[57] ABSTRACT

A digital-to-analog converter (DAC) and a method of converting digital numbers to analog equivalents. In one embodiment, the DAC includes: (1) a data decoder that receives a digital number and an input clock signal and develops therefrom SIGN and M control signals and complementary $\phi_1$ and $\phi_2$ clock signals and (2) a conversion circuit, coupled to the data decoder and including first and second operational amplifiers (op amps), a switching circuit and sampling and integrating capacitors, the switching circuit coupling positive and negative reference voltages to the sampling capacitors as a function of states of the SIGN and M control signals and adjusting feedback loops associated with the first and second op amps as a function of states of the $\phi_1$ and $\phi_2$ clock signals, the first and second op amps generating a voltage difference at outputs thereof representing an analog equivalent of the digital number.

20 Claims, 5 Drawing Sheets

FIVE-LEVEL SWITCHED-CAPACITOR DAC, METHOD OF OPERATION THEREOF AND SIGMA-DELTA CONVERTER EMPLOYING THE SAME

TECHNICAL FIELD OF THE INVENTION

The present invention is directed, in general, to digital-to-analog converters (DACS) and, more specifically, to five-level, switched-capacitor DACs having extremely high analog output linearity.

BACKGROUND OF THE INVENTION

Digital-to-analog converters (DACs) are devices that generate an analog signal from a digital signal provided thereto. DACs are used in a variety of applications including voice and video communicators, measurement and testing devices, automatic process control devices and data telemetry devices.

Two kinds of errors are encountered in the conversion of the digital signal or number to the analog signal (e.g., voltage level), namely, quantization errors and errors due to the non-ideality of the DAC. Quantization errors arise by virtue of the finite number of bits that are available to approximate the analog voltage level. The digital number is rarely more than an approximation of the real analog world made by a finite level of quantization and the errors in quantization cannot be compensated or overcome with the use of an ideal DAC.

Two characteristics (namely, resolution and accuracy) play an important role in the imperfect nature of DACs. Resolution is the smallest increment in voltage that can be discerned by the circuit and relates primarily to the number of bits of the input. For example, a 4-bit DAC has a percent resolution of 6.25% ($\frac{1}{16}$) and a 10-bit DAC has an approximate resolution of 0.1% ($\frac{1}{1024}$). Accuracy is the difference between the actual analog output and the theoretical output of a given digital word. Accuracy errors include integral and differential linearity errors. Integral non-linearity is the degree to which the analog output deviates from a straight line that extends over the full range of the waveform. Differential linearity is the difference between the deviation between the steps of a staircase waveform and the least significant bit (LSB). For instance, a differential linearity error greater than one LSB can lead to a missing code and/or non-monotonic response.

It should be noted that the two parameters, resolution and accuracy, described above are not necessarily related. For example, a DAC may have high resolution but low accuracy, and vice versa. Some applications require high resolution, but not necessarily greater accuracy. Other applications may have accuracy as the primary consideration and may disregard resolution. Sigma-delta ($\Sigma\Delta$) data converters are one example where a DAC of high linearity but low resolution is required.

Sigma-delta ($\Sigma\Delta$) data DACs have recently come into widespread use with the development of process technologies and the increase in digital audio and other applications. $\Sigma\Delta$ converters using oversampling (i.e., sampling at rates greater than the Nyquist rate) and quantization noise-shaping techniques demonstrate high resolution while placing modest demands on component matching and circuit performance. The $\Sigma\Delta$ converters also reduces the number of quantization levels to a minimum (i.e., two levels (one bit) or three levels). Additionally, the $\Sigma\Delta$ converters are suitable for integrated circuit technologies. High order ($\geq 3$) single-loop DACs, for example, using one-bit (two-level) quantization can achieve more than 16-bit resolution.

The greatest strength of the one-bit $\Sigma\Delta$ converters is the inherent linearity of the one-bit internal DAC. However, one-bit $\Sigma\Delta$ converters usually require large oversampling ratios to achieve high resolution thereby placing heavy demands on the circuit operating speed and power dissipation, especially when a large portion of the power in high-resolution $\Sigma\Delta$ converters is dissipated in the digital circuitry. Additionally, one-bit $\Sigma\Delta$ converters suffer from idle-tone problems that often require dithering and high out-of-band noise that makes it difficult to design the output reconstruction filters either in the digital domain for analog-to-digital DACs or analog domain for DACs.

Multibit $\Sigma\Delta$ converters (i.e., more than two quantization levels) exhibit more robust stability characteristics with wider signal range, better immunity to idle-tone problems and lower out-of-band noise than one-bit $\Sigma\Delta$ converters. The primary drawback with multibit $\Sigma\Delta$ converters is the non-linearity of the corresponding internal multibit DAC, which can cause increased signal distortion and noise.

The most common problem affecting linearity in DACs designed with integrated circuits (ICs) is the mismatching of the components. Mismatching occurs when two components, typically resistors or capacitors, with identical rated values are not equal. The differences in actual values are the result of deviations in the manufacturing process. Currently, pairs of resistors and capacitors may be matched to within 0.1%. This 0.1% matching of components corresponds to, approximately, a 10-bit conversion linearity. In some applications, however, a 10-bit conversion linearity is insufficient. For instance, in audio applications, a 14-bit conversion linearity may be required and, in video applications, a 12-bit conversion linearity may be required.

Traditional switched-capacitor DAC techniques include binary-weighted capacitor array, ratio-independent and self-calibrating DACs. The linearity of the binary-weighted capacitor array DAC is limited by the capacitor ratio accuracy of metal-oxide-semiconductor (MOS) technologies. Currently, with careful layout techniques, linearities of up to 11-bit can be achieved. The ratio-independent DAC requires a large gain from the operational amplifier, which can be difficult to obtain in high speed operations. The self-calibrating DAC requires extra power, chip area and more complex circuitry.

A five-level switched-capacitor DAC is described in "A 22-kHz Multibit Switched-Capacitor Sigma-delta Converter with 92 dB Dynamic Range," by Ju, et al. (Ju), IEEE Journal of Solid-State Circuits, 30(12): 1316–1324, (December 1995), which is herein incorporated by reference. Ju provides 16-bit linearity with a capacitor ratio error of 1%. While Ju discloses a DAC that achieves a high level of performance, the conversion period for the DAC requires up to three clock cycles.

Accordingly, what is needed in the art is an improved DAC that achieves shorter conversion periods and increased conversion linearities in the operation thereof.

SUMMARY OF THE INVENTION

To address the above-discussed deficiencies of the prior art, the present invention provides a DAC and a method of converting digital numbers to analog equivalents. In one embodiment, the DAC includes: (1) a data decoder that receives a digital number and an input clock signal and develops therefrom SIGN (and, in one embodiment $\overline{\text{SIGN}}$) and M (which may be, for instance, $M_1$, $M_2$, and $M_0$) control signals and complementary non-overlapping $\phi_1$ and $\phi_2$ clock signals and (2) a differential switched-capacitor integrator and three reference voltages (positive, negative and ground), that under the control of the signals generated by the data decoder, produces an output voltage thereof representing an analog equivalent of the input digital number. The present invention introduces a DAC having extremely high (perhaps as high as 16 bit) linearity and fast conversion rate (as fast as the input clock rate).

The positive reference voltage, $V_{RP}$, and the negative reference voltage, $V_{RN}$, have the same amplitude but opposite polarity referenced to the ground. For example, $V_{RP}=-V_{RN}=V_R$ Volt, where $V_R$ is the reference voltage value.

In one embodiment of the present invention, the input digital number is three bits long in two's complement format. Only five of the eight possible values represented by the three-bit number are used, corresponding to $-2, -1, 0, 1$, and $2$. The equivalent analog output voltages are $-V_R$, $-\frac{1}{2}V_R$, $0$, $+\frac{1}{2}V_R$ and $+V_R$, respectively.

In one embodiment of the present invention, the differential switched-capacitor integrator further includes two single-ended switched-capacitor integrators, each of which includes an operational amplifier (op amp), a sampling capacitor, an integrating capacitor, and a switching circuit.

In each single-ended switched-capacitor integrator, one terminal of the sampling capacitor is always connected to the inverting input terminal of the op amp in the same integrator. The other terminal of the same sampling capacitor is connected to either the positive reference voltage, the negative reference voltage or the ground through a set of transistor switches controlled by the signals of signals SIGN, M, $\phi_1$, $\phi_2$ and combinations of SIGN and M. One terminal of the integrating capacitor is always connected to the inverting input of the op amp in the same integrator, while the other terminal of the same integrating capacitor is connected to either the output terminal of the same op amp or the ground through two transistor switches controlled by $\phi_1$ and $\phi_2$ respectively.

In the present invention, the output analog voltage is taken as the difference between the output voltage of the first integrator and the output voltage of the second integrator. The output node of the first integrator is defined as the positive terminal and the output node of the second integrator is defined as the negative terminal of the output analog voltage.

As will be described more fully, the present invention makes advantages use of matched pairs of op amps and matched pair capacitors (the two pairs of sampling and integrating capacitors).

In one embodiment of the present invention, the DAC converts the input digital number to the analog equivalent in a single cycle of the input clock signal. The speed at which the DAC of the present invention has the potential to operate makes it attractive for audio and video applications.

The foregoing has outlined, rather broadly, preferred and alternative features of the present invention so that those skilled in the art may better understand the detailed description of the invention that follows. Additional features of the invention will is be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
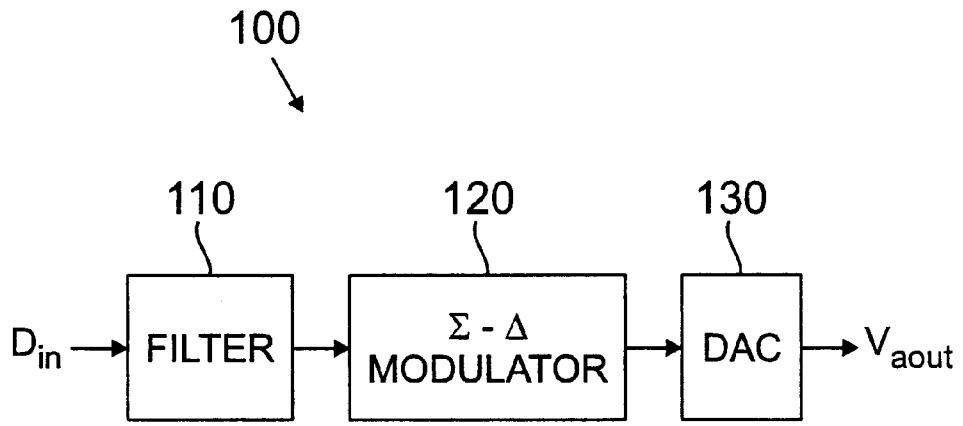
FIG. 1 illustrates a block diagram of an embodiment of a multibit ΣΔ digital-to-analog converter employing an exemplary five-level switched-capacitor DAC of the present invention.

Referring initially to FIG. 1, illustrated is a block diagram of an embodiment of a multibit ΣΔ digital-to-analog converter 100 employing an exemplary five-level switched-capacitor DAC 130 of the present invention. The converter 100 includes an interpolating filter 110 coupled to a ΣΔ modulator 120. The ΣΔ modulator 120 is also coupled to the five-level switched-capacitor DAC 130.

The interpolating filter 110 upsamples the digital input $D_{in}$ and performs low-pass filtering on the upsampled data to remove baseband images at certain frequency multiples. The ΣΔ modulator 120 quantizes the data from the interpolating filter 110 down to five levels. The ΣΔ modulator 120 also shapes the quantization noise and suppresses the noise in the baseband. The five-level switched-capacitor DAC 130 converts the noise-shaped digital data into their corresponding analog output values $V_{aout}$.

Figure 2:
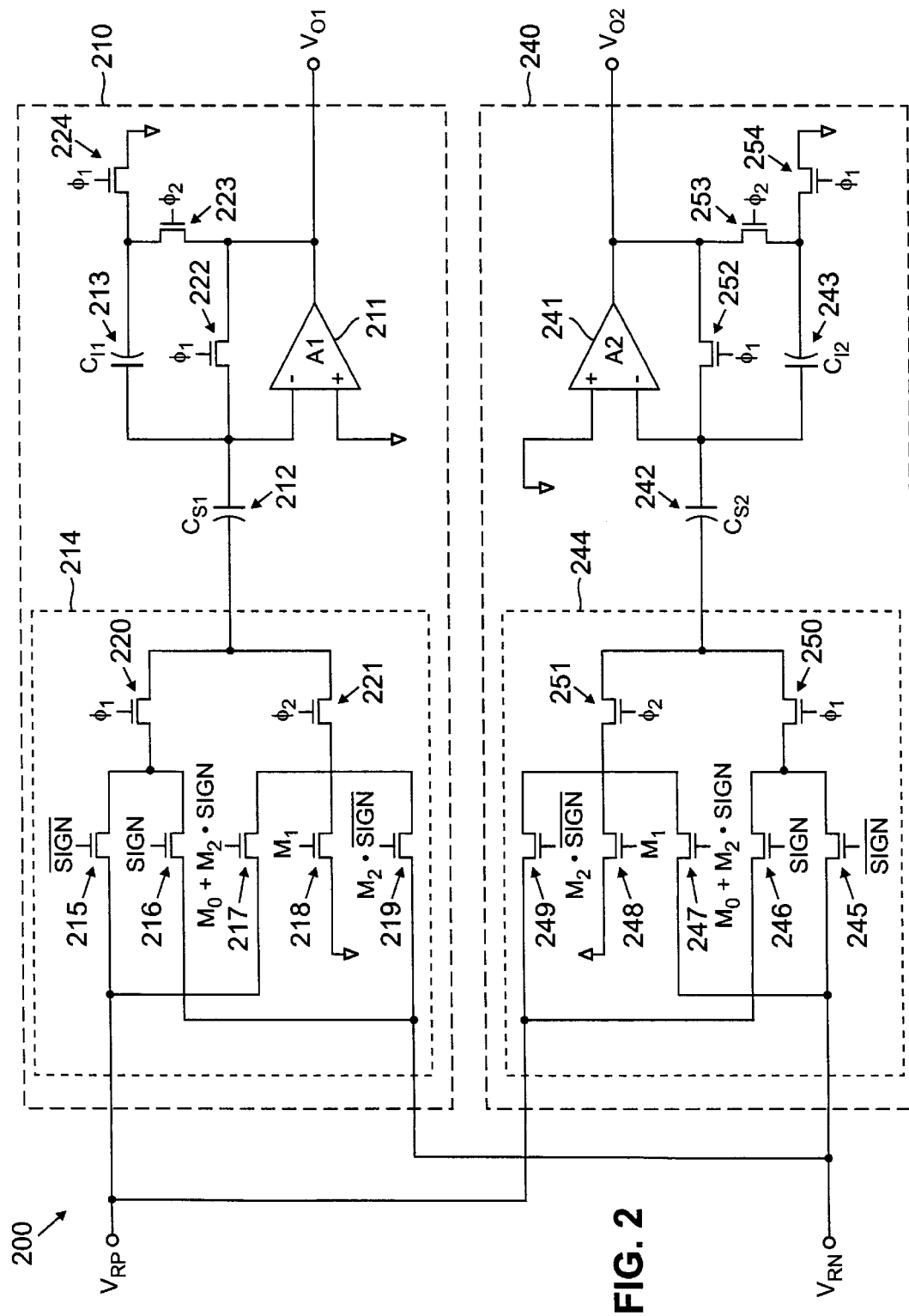
FIG. 2 illustrates a schematic diagram of a conversion circuit constructed according to the principles of the present invention.

Turning now to FIG. 2, illustrated is a schematic diagram of an embodiment of a conversion circuit 200 constructed according to the principles of the present invention. The conversion circuit 200 includes a first single-ended switched-capacitor integrator 210 and a second single-ended switched-capacitor integrator 240.

The first switched-capacitor integrator 210 includes a first op amp 211 having its noninverting input connected to ground. A first (sampling) capacitor 212 has one plate connected to the inverting input of the first op amp 211 and the other plate connected to a first switching circuit 214. A second (integrating) capacitor 213 has one plate connected to the inverting input of the first op amp 211 and the other plate connected to a first switch transistor 224, which is controlled by a clock signal $\phi_1$ to the ground, and a second switch transistor 223 which is controlled by a clock signal $\phi_2$. The second switch transistor 223 is also connected to the output of the first op amp 211, forming a negative feedback loop to the inverting input of the first op amp 211. A third switch 222, controlled by the clock signal $\phi_1$, is connected between the inverting input and the output of the first op amp 211 to form another negative feedback loop around the first op amp 211.

The first switching circuit 214 includes a fourth switch transistor 220 controlled by the clock signal $\phi_1$. One end of the fourth switch transistor 220 is connected to the first capacitor 212, and the other end of the fourth switch transistor 220 is connected through a fifth switch transistor 215, which is controlled by the signal $\overline{SIGN}$, to the positive reference voltage $V_{RP}$. The fourth switch transistor 220 is also connected through a sixth switch transistor 216, which is controlled by the signal SIGN, to the negative reference voltage $V_{RN}$. A seventh switch transistor 221 is controlled by the clock signal $\phi_2$. One end of the seventh switch transistor 221 is connected to the first capacitor 212, and the other end of the seventh switch transistor 221 is connected through an eighth switch transistor 217, which is controlled by the signal $(M_0+M_2)$SIGN, to the positive reference voltage $V_{RP}$. The seventh switch transist or 221 is also connected through a ninth switch transistor 218, which is controlled by the signal $M_1$, to the ground, and through a tenth switch transistor 219, which is controlled by the signal $M_2$ $\overline{SIGN}$, to the negative reference voltage $V_{RN}$.

The second switched-capacitor integrator 240 includes a second op amp 241, a third (sampling) capacitor 242, a fourth (integrating) capacitor 243, an eleventh, twelfth, thirteen switch transistors 254, 253, 252 and a second switching circuit 244. The second switching circuit 244 includes a fourteenth, fifteen, sixteen, seventeen, eighteen, nineteen and twentieth switch transistors 250, 245, 246, 251, 247, 248, 249.

The second switched-capacitor integrator 240 is analogous to the first switched-capacitor integrator 210. The first and second switched-capacitor integrators 210, 240 have the same internal composition (i.e., op amps, capacitors and switch transistors), the same internal connections and the same control signals to the corresponding switch transistors. For example, the switch transistor 220 in the first switched-capacitor integrator 210 and the corresponding fourteen switch transistor 250 in the second switched-capacitor integrator 240 are controlled by the same clock signal $\phi_1$. The only difference between the first switched-capacitor integrator 210 and the second switched-capacitor integrator 240 are their connections to the positive and negative reference voltages. Whereas a device in the first switched-capacitor integrator 210 is connected to the positive reference voltage $V_{RP}$, the corresponding device in the second switched-capacitor integrator 240 is connected to the negative reference voltage $V_{RN}$, and vice versa. To further illustrate, the fifth and eight switch transistors 215, 217 in the first switched-capacitor integrator 210 are connected to $V_{RP}$, while the corresponding fifteen and eighteen switch transistors 245, 247 in the second switched-capacitor integrator 240 are connected to $V_{RN}$.

In an advantageous embodiment, the switch transistors described above are metal-oxide-semiconductor (MOS) transistors. The present invention, however, is not limited to a specific switching device or configuration. The op amps, switches and capacitors make up a conversion circuit constructed according to the principles of the present embodiment.

Figure 3:
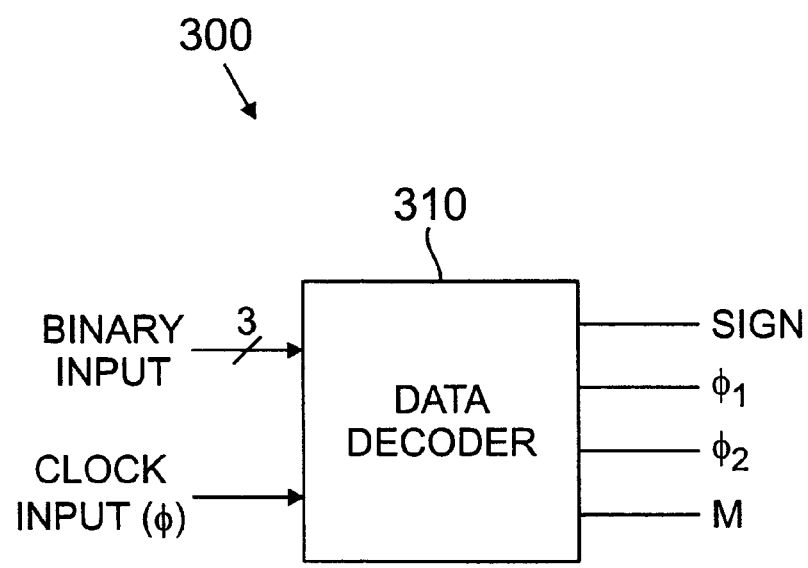
FIG. 3 illustrates an exemplary data decoding and control scheme depicting a plurality of control signals for specific binary inputs.

Turning now to FIG. 3, illustrated is an exemplary data decoding and control scheme 300 depicting a plurality of control signals for specific binary inputs. A data decoder 310 converts the 3-bit binary input data into pulses and clock signals. Those skilled in the art should appreciate that the data decoder 310 may be implemented in hardware, software or a combination thereof. The present invention is not limited to a particular data decoder implementation or design scheme.

Table I below illustrates exemplary control signals (e.g., SIGN and $M_x$) and exemplary output voltages produced by the first and second switched-capacitor integrators 210, 240, depicted in FIG. 2, for a binary input m; the 0s and 1s in the SIGN and $M_x$ (for x=0, 1, 2) columns indicate logic "low" and logic "high", respectively. The control signals and clock signals are used to turn ON or OFF the switch transistors in the first and second switched-capacitor integrators 210, 240. Variables $K_1$ and $K_2$ are equal to $C_{s1}/C_{f1}$ and $C_{s2}/C_{f2}$, respectively, and constants $g_1$ and $g_2$ are very close to 1.

In an advantageous embodiment, the clock signals $\phi_1$ and $\phi_2$ are complementary and non-overlapping to each other. The clock signal $\phi_1$ is a logic "high" for a first half of the clock cycle and the clock signal $\phi_2$ is a logic "high" for the second half of the clock is cycle. The control signals SIGN and $M_x$ are synchronized with the clock signal $\phi_1$, such that, at the instant $\phi_1$ transitions from a "0" to a "1", at the beginning of a clock cycle, SIGN and $M_x$'s become valid. SIGN and $M_x$'s will not change their value until the next time when $\phi_1$ changes from a "0" to a "1".

TABLE I

| Input (m) | SIGN | $\overline{SIGN}$ | $M_0$ | $M_1$ | $M_2$ | $V_{O1}$ | $V_{O2}$ |
|---|---|---|---|---|---|---|---|
| −2 | 1 | 0 | 0 | 0 | 1 | $-g_1K_1 (V_{RP}-V_{RN})$ | $g_2K_2 (V_{RP}-V_{RN})$ |
| −1 | 1 | 0 | 0 | 1 | 0 | $g_1K_1V_{RN}$ | $g_2K_2V_{RP}$ |
| 0 | 0 | 1 | 1 | 0 | 0 | 0 | 0 |
| 1 | 0 | 1 | 0 | 1 | 0 | $g_1K_1V_{RP}$ | $g_2K_2V_{RN}$ |
| 2 | 0 | 1 | 0 | 0 | 1 | $g_1K_1 (V_{RP}-V_{RN})$ | $-g_2K_2 (V_{RP}-V_{RN})$ |

Figure 4B:
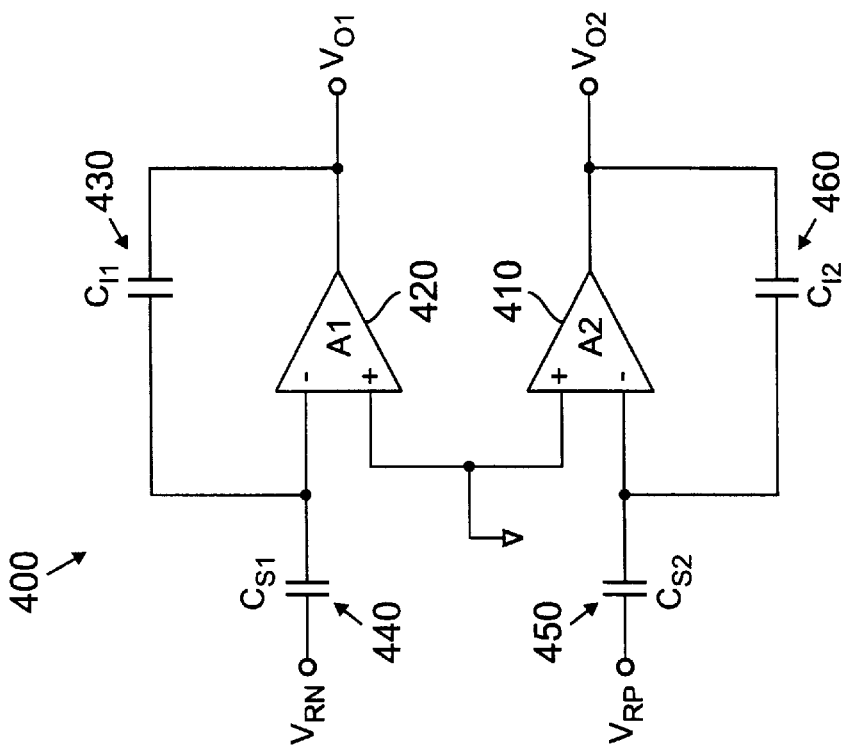
FIGS. 4A and 4B illustrate exemplary circuit configurations of an embodiment of a five-level switched-capacitor DAC of the present invention with the binary input value of +2.
Figure 4A:
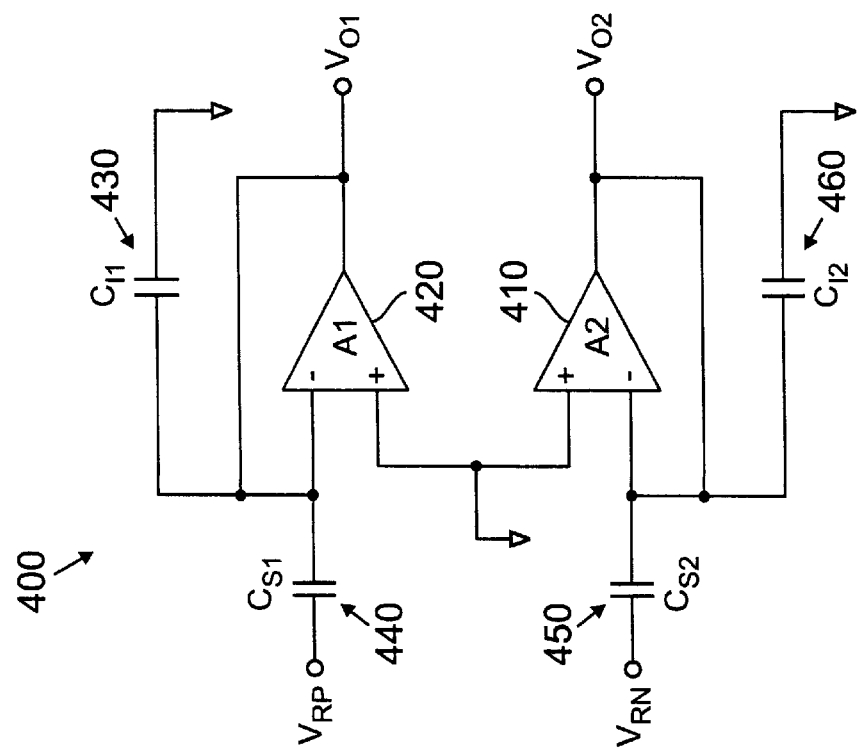

Turning now to FIGS. 4A and 4B, illustrated are exemplary circuit configurations of an embodiment of a five-level switched-capacitor DAC 400 when the binary input has a value of +2. As set forth in Table I, given a binary input value of +2, the resulting control signals for a first half-cycle of a clock pulse are as follows: SIGN=0, $\overline{SIGN}$=1, $M_0$=0, $M_1$=0, $M_2$=1, $\phi_1$=1 and $\phi_2$=0. FIG. 4A illustrates the circuit configuration of the five-level switched-capacitor DAC 400 after application of the control signals and the clock pulse to the switches. FIG. 4A includes a first op amp 420 having the noninverting input coupled to a ground and the inverting input coupled to a first capacitor 440. A second capacitor 430 is also coupled to the inverting input of the first op amp 420 and to the ground. The first op amp 420 is configured as an unity-gain amplifier with the inverting input "short circuited" to the output $V_{o1}$ of the first op amp 420. The first capacitor 440 is also coupled to a positive reference voltage $V_{RP}$. A second op amp 410 is similarly configured as an unity-gain amplifier with the inverting input coupled to the output $V_{o2}$ of the second op amp 410. The noninverting input of the second op amp 410 is also coupled to the ground. A third capacitor 450 couples the inverting input of the second op amp 410 to a negative reference voltage $V_{RN}$, while a fourth capacitor 460 couples the inverting input of the second op amp 410 to the ground.

For the second half-cycle of the clock pulse, the control signals and clock pulse applied to the switches are still SIGN=0, $\overline{SIGN}$=1, $M_0$=0, $M_1$=0, $M_2$=1, but now $\phi_1$=0 and $\phi_2$=1. FIG. 4B depicts the five-level switched-capacitor DAC 400 circuit after application of the control signals and clock pulse. Those skilled in the art should recognize that the first and second op amps 420, 410 are configured as integrators with the feedback-connected second and fourth "integrator" capacitors 430, 460 coupled between the inverting inputs and outputs of the first and second op amps 420, 410, respectively. Also, the input reference voltages $V_{rn}$, $V_{rp}$, are reversed with the first capacitor 440 coupled to the negative reference voltage $V_{rn}$ and the third capacitor 450 coupled to the positive reference voltage $V_{rp}$.

Figure 5:
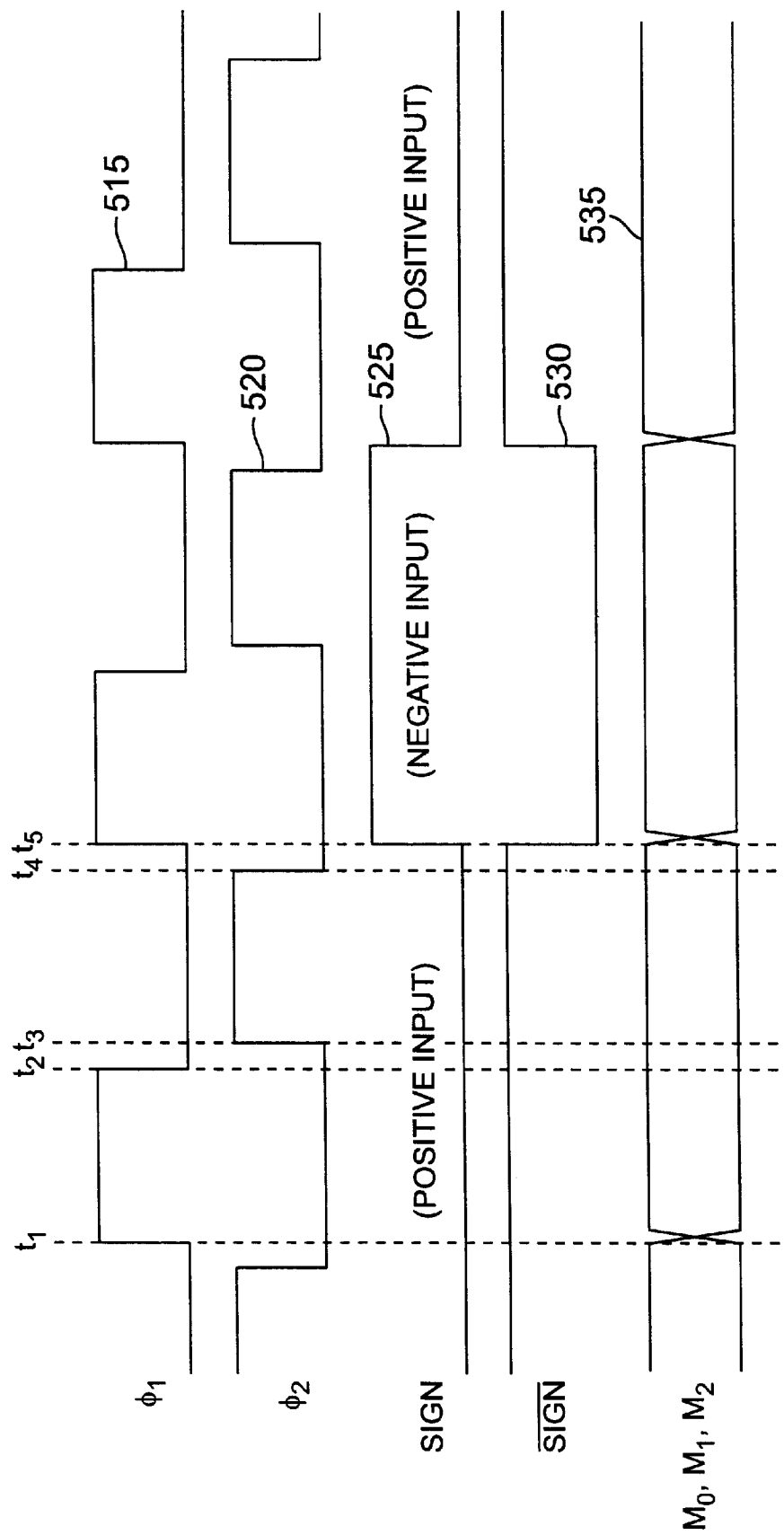
FIG. 5 illustrates a timing diagram that depicts waveforms of selected control signals and clock pulses during an exemplary conversion cycle of an embodiment of a five-level switched-capacitor DAC of the present invention.

Turning now to FIG. 5, illustrated is a timing diagram that depicts waveforms of selected control signals and clock pulses during an exemplary conversion cycle of an embodiment of the five-level switched-capacitor DAC 200 of the FIG. 2. The basic operation of the five-level switched-capacitor DAC 200 will hereinafter be described.

A first waveform 515 illustrates the clock pulse $\phi_1$ for the first, third and fourth switch transistors 224, 222, 220 in the first switched-capacitor integrator 210 and eleventh, thirteen and fourteen switch transistors 254, 252, 250 in the second switched-capacitor integrator 240. A second waveform 520 illustrates the clock pulse $\phi_2$ for the second and seventh switch transistors 223, 221 in the first switched-capacitor integrator 210 and twelfth and seventeen switch transistors 253, 251 in the second switched-capacitor integrator 240. The time between $t_2$ and $t_3$ is the non-overlapping time between the two clock signals. The control signal SIGN is defined according to a two's complement format, that when the input digital number is positive (including zero), SIGN will be a logic "low" (0). When the input digital number is negative, SIGN will be a logic "high" (1). A third waveform 525 illustrates the SIGN control signal generated by the data decoder 310 after a binary input m is sampled for a input sequence of "positive", "negative" and "positive". A fourth waveform 530 illustrates the control signal $\overline{\text{SIGN}}$, which is the inverse of the signal SIGN. A fifth waveform 535 illustrates the control signals $M_0$, $M_1$, and $M_2$. As shown in TABLE I, only one of these three signals is a logic "high" in any given conversion cycle. It should be noted that the relative sizes of the separations between the time periods $t_1$, $t_2$, $t_3$, $t_4$, $t_5$ are drawn for clarity and ease of explanation, and are not necessarily to scale.

For illustrative purposes, the binary input m is assumed to have the value of +2. At a time $t=t_1$, the data decoder 310 generates the following control signals in phase 1 (when $\phi_1=1$ and $\phi_2=0$) of the conversion period: SIGN=0, $\overline{\text{SIGN}}=1$, $M_0=0$, $M_1=0$ and $M_2=1$. The first, third, fourth, fifth, tenth, eleventh, thirteenth, fourteen, fifteen and twentieth switch transistors 224, 222, 220, 215, 219, 254, 252, 250, 245, 249 are turned ON and the remaining switch transistors are turned OFF resulting in the circuit configuration analogous to the configuration of FIG. 4A. From the time period $t=t_1$ to $t_2$, the first and third capacitors 440, 450 sample the reference voltages $V_{RP}$, $V_{RN}$, respectively. At the time $t=t_3$, which is the beginning of phase 2 (when $\phi_1=0$ and $\phi_2=1$) of the conversion period, the first, third, fourth, eleventh, thirteen and fourteen switch transistors 224, 222, 220, 254, 252, 250 are turned OFF and the second, seventh, twelfth and seventeen switch transistors 223, 221, 253, 251 are turned ON. The control signals remain the same as in phase 1, resulting in a circuit configuration analogous to the configuration of FIG. 4B. At a time $t=t_4$, the output of the first and second op amps 420, 410 are as follows:

$$V_{O1} = g_1\left(\frac{A_1}{A_1+1}\right)(V_{RP}-V_{RN})\left(\frac{C_{S1}}{C_{I1}}\right)+V_{OS1}\left(\frac{A_1}{A_1+1}\right)\left(1-\left(\frac{A_1}{A_1+1}\right)g_1\right) \quad (1)$$

$$V_{O2} = g_2\left(\frac{A_2}{A_2+1}\right)(V_{RN}-V_{RP})\left(\frac{C_{S2}}{C_{I2}}\right)+V_{OS2}\left(\frac{A_2}{A_2+1}\right)\left(1-\left(\frac{A_2}{A_2+1}\right)g_2\right) \quad (2)$$

where:

$$g_1 = \frac{1}{1+\left(\frac{1}{A_1+1}\right)\left(\frac{C_{S1}}{C_{I1}}\right)}$$

$$g_2 = \frac{1}{1+\left(\frac{1}{A_2+1}\right)\left(\frac{C_{S2}}{C_{I2}}\right)}$$

$V_{OS1}$ is the input offset voltage of the first op amp 420;
$V_{OS2}$ is the input offset voltage of the second op amp 410;
$A_1$ is the gain of the first op amp 420; and
$A_2$ is the gain of the second op amp 410.

Assuming $A_1 \cong A_2 = A \gg 1$ and $V_{OS1} = V_{OS2} = V_{OS}$, then $$f(V_{OS}) = \left(\frac{A_1}{A_1+1}\right)V_{OS1}\left(1-g_1\left(\frac{A_1}{A_1+1}\right)\right)-$$
$$\left(\frac{A_2}{A_2+2}\right)V_{OS2}\left(1-g_2\left(\frac{A_2}{A_2+1}\right)\right)$$
$$= \left(\frac{A}{A+1}\right)^2\left(\frac{1}{A}\right)\left(\frac{C_{S1}}{C_{I1}}-\frac{C_{S2}}{C_{I2}}\right)V_{OS} \ll V_{OS}$$

Therefore:

$$V(2) = V_{OUT} = V_{O1} - V_{O2} \quad (3)$$

$$V(2) = \left(\frac{A}{A+1}\right)(V_{RP}-V_{RN})\left(g_1\frac{C_{S1}}{C_{I1}}+g_2\frac{C_{S2}}{C_{I2}}\right)+f(V_{OS})$$

Similarly:

$$V(1) = \left(\frac{A}{A+1}\right)\left(V_{RP}g_1\frac{C_{S1}}{C_{I1}}-V_{RN}g_2\frac{C_{S2}}{C_{I2}}\right)+f(V_{OS}) \quad (4)$$

$$V(0) = f(V_{OS}) \quad (5)$$

$$V(-1) = \left(\frac{A}{A+1}\right)\left(V_{RN}g_1\frac{C_{S1}}{C_{I1}}-V_{RP}g_2\frac{C_{S2}}{C_{I2}}\right)+f(V_{OS}) \quad (6)$$

$$V(-2) = \left(\frac{A}{A+1}\right)(V_{RN}-V_{RP})\left(g_1\frac{C_{S1}}{C_{I1}}+g_2\frac{C_{S2}}{C_{I2}}\right)+f(V_{OS}) \quad (7)$$

The waveforms of FIG. 5 and the equations above demonstrate that the five-level switched-capacitor DAC of the present invention provides a digital to analog conversion using only one clock cycle; the five-level switched-capacitor DAC is, therefore, well suited for use in high-speed data conversion applications.

Figure 6:
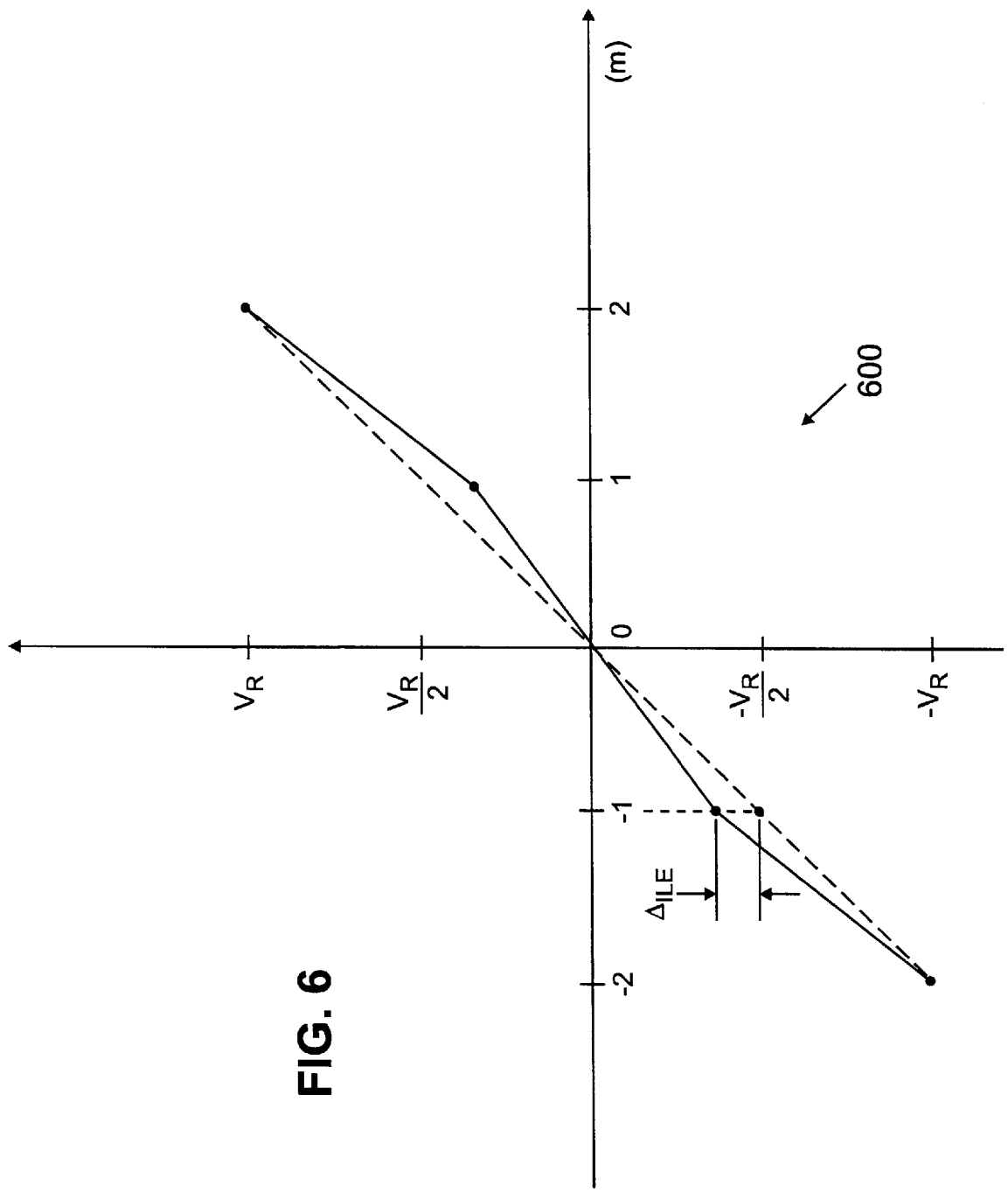
FIG. 6 illustrates a graph depicting the linearity performance of an embodiment of a five-level switched-capacitor DAC of the present invention.

Turning now to FIG. 6, illustrated is a graph 600 depicting the linearity performance of an exemplary five-level switched-capacitor DAC of the present invention. FIG. 6 includes a dashed straight line connecting two endpoints representing an ideal transfer function 610 of the five-level switched-capacitor DAC and another line representing the transfer function 620 of the exemplary five-level switched-capacitor DAC. The horizontal axis of graph 600 represents the digital input m and the vertical axis depicts the output of the five-level switched-capacitor DAC. For five levels (±2, ±1 and 0), the ideal step size $\Delta V_{ideal}$ is given as:

$$\Delta V_{ideal} = \frac{V(2)-V(-2)}{4} \quad (8)$$

-continued
$$\Delta V_{ideal} = \frac{1}{2}\left(\frac{A}{A+1}\right)(V_{RP} - V_{RN})\left(g_1\frac{C_{S1}}{C_{I1}} + g_2\frac{C_{S2}}{C_{I2}}\right)$$

The ideal output voltages for inputs 2, 1, 0, −1, and −2 are:

$$V_{id}(-2) = V(-2) \quad (9)$$

$$V_{id}(1) = \qquad (10)$$
$$3\Delta V_{ideal} + V_{id}(-2) = \frac{1}{2}(V_{RP} - V_{RN})\left(g_1\frac{C_{S1}}{C_{I1}} + g_2\frac{C_{S2}}{C_{I2}}\right) + f(V_{OS})$$

$$V_{id}(0) = f(V_{OS}) = 2\Delta V_{ideal} + V_{id}(-2) \quad (11)$$

$$V_{id}(-1) = \Delta V_{ideal} + V_{id}(-2) = \qquad (12)$$
$$-\frac{1}{2}\left(\frac{A}{A+1}\right)(V_{RP} - V_{RN})\left(g_1\frac{C_{S1}}{C_{I1}} + g_2\frac{C_{S2}}{C_{I2}}\right) + f(V_{OS})$$

$$V_{id}(2) = V(2) \quad (13)$$

The endpoint integral linearity error (ILE) for a given input value m is defined as:

$$\Delta_m = \frac{V(m) - V_{id}(m)}{V_F}$$

where m=−2, −1, 0, 1, 2.

$$V_F = \text{full scale differential output} = 2(V_{RF} - V_{RN}) = 4V_R\left(1 + \frac{\Delta V_R}{2V_R}\right)$$

Assuming $C_{S1} \cong C_{S2} \cong C$, $C_{I1} \cong C_{I2} \cong 2C$, $V_{RP} = V_R$ and $V_{RN} = -(V_R + \Delta V_R)$, therefore $\Delta_2 = \Delta_{-2} = \Delta_0 = 0$, and $$\Delta_1 \geq -\frac{1}{8}\frac{\Delta V_R}{V_R}\frac{\Delta C}{C} \quad \Delta_1 \leq \frac{1}{8}\frac{\Delta V_R}{V_R}\frac{\Delta C}{C}$$

$$\Delta_{-1} \geq -\frac{1}{8}\frac{\Delta V_R}{V_R}\frac{\Delta C}{C} \quad \Delta_{-1} = \leq \frac{1}{8}\frac{\Delta V_R}{V_R}\frac{\Delta C}{C}$$

The integral linearity error of the DAC is:

$$|\Delta_{ILE}| \leq \frac{1}{8}\frac{\Delta V_R}{V_R}\frac{\Delta C}{C} \quad (14)$$

and the differential linearity error of the DAC is:

$$\Delta_{DLE} = \frac{(V(2) - V(1)) - (V(1) - V(0))}{|\Delta_{DLE}| \leq \frac{\Delta V_R}{V_R}\frac{\Delta C}{C}} \quad (15)$$

As can be seen from the above, the ILE and the DLE of the five-level switched-capacitor DAC of the present invention are proportional to the reference voltage ratio error ($\Delta V_R/V_R$) and the capacitor ratio error ($\Delta C/C$). The reference voltage ratio error depends on the implementation of the reference voltage circuit (not shown). With the use of resistor matching topologies in the reference voltage circuit (e.g., resistor string), the reference voltage error may be substituted with the resistor mismatching or resistor ratio error ($\Delta R/R$) and the linearity errors become:

$$|\Delta_{ILE}| \leq \frac{1}{8}\frac{\Delta R}{R}\frac{\Delta C}{C} \quad (16)$$

$$|\Delta_{DLE}| \leq \frac{\Delta R}{R}\frac{\Delta C}{C} \quad (17)$$

The $\Delta_{ILE}$ and $\Delta_{DLE}$ above illustrate that the conversion linearity of the five-level switched-capacitor DAC of the present invention only depends on the matching properties of the capacitors and the resistors used in the implementation of the DAC. As previously described, pairs of resistors and capacitors may be matched to within 0.1% and the linearity errors may be reduced to $|\Delta_{ILE}| \leq 1 \times 10^{-7}$ and $|\Delta DLE| \leq 1 \times 10^{-6}$ thereby resulting in a DAC providing >20-bit linearity with a conversion period of only one clock cycle.

While specific embodiments of a DAC and associated method of operation have heretofore been described, other embodiments including a data decoder and conversion circuit, or equivalents thereof, are well within the broad scope of the present invention.

Although the present invention and its advantages have been described in detail, those skilled in the art should understand that they can make various changes, substitutions and alterations herein without departing from the spirit and scope of the invention in its broadest form.

What is claimed is:

1. A digital-to-analog converter (DAC), comprising:
   a data decoder that receives a digital number and an input clock signal and develops therefrom SIGN and M control signals and complementary $\phi_1$ and $\phi_2$ clock signals; and
   a conversion circuit, coupled to said data decoder and including first and second operational amplifiers (op amps), a switching circuit and sampling and integrating capacitors, said switching circuit coupling positive and negative reference voltages to said sampling capacitors as a function of states of said SIGN and M control signals and adjusting feedback loops associated with said first and second op amps as a function of states of said $\phi_1$ and $\phi_2$ clock signals, said first and second op amps generating a voltage difference at outputs thereof representing an analog equivalent of said digital number.

2. The DAC as recited in claim 1 wherein said switching circuit having a plurality of transistor switches that selectively couple said positive and negative reference voltages to said inputs of said first and second op amps.

3. The DAC as recited in claim 1 wherein said positive and negative reference voltages pass through matched sampling capacitors before being provided to said inputs of said first and second op amps.

4. The DAC as recited in claim 1 wherein said conversion circuit includes a matched pair of op amps.

5. The DAC as recited in claim 1 wherein said feedback loops include matched integrating capacitors.

6. The DAC as recited in claim 1 wherein said DAC converts said digital number to said analog equivalent in a single cycle of said input clock signal.

7. The DAC as recited in claim 1 wherein said digital number is three bits long.

8. A method of converting a digital number to an analog equivalent, comprising the steps of:
   developing SIGN and M control signals and complementary $\phi_1$ and $\phi_2$ clock signals from said digital number and an input clock signal;

supplying positive and negative reference voltages to sampling capacitors as a function of states of said SIGN and M control signals; and adjusting feedback loops associated with first and second op amps as a function of states of said $\phi_1$ and $\phi_2$ clock signals, said first and second op amps generating a voltage difference at outputs thereof representing said analog equivalent of said digital number.

9. The method as recited in claim 8 wherein said step of supplying comprises the step of employing a switching circuit having a plurality of transistor switches selectively to couple said positive and negative reference voltages to said inputs of said first and second op amps.

10. The method as recited in claim 8 wherein said step of supplying comprises the step of passing said positive and negative reference voltages through matched sampling capacitors before being provided to said inputs of said first and second op amps.

11. The method as recited in claim 8 wherein said step of supplying comprises the step of passing said positive and negative reference voltages through a matched pair of op amps.

12. The method as recited in claim 8 wherein said feedback loops include matched integrating capacitors.

13. The method as recited in claim 8 wherein said steps of developing, supplying and adjusting occur during a single cycle of said input clock signal.

14. The method as recited in claim 8 wherein said digital number is three bits long.

15. A multibit digital-to-analog converter, comprising:
    an interpolating filter that upsamples a digital input to yield upsampled data and performs low pass filtering on the upsampled data to remove baseband images therein;
    a sigma-delta ($\Sigma\Delta$) modulator, coupled to said interpolating filter, that quantizes said upsampled data to five levels and shapes and suppresses quantizing noise in said upsampled data to yield a three bit digital number; and
    a five-level digital-to-analog converter (DAC), coupled to said $\Sigma\Delta$ modulator, including:
        a data decoder that receives said three bit digital number and an input clock signal and develops therefrom SIGN and M control signals and complementary $\phi_1$ and $\phi_2$ clock signals, and
        a conversion circuit, coupled to said data decoder and including first and second operational amplifiers (op amps), a switching circuit and sampling and integrating capacitors, said switching circuit coupling positive and negative reference voltages to said sampling capacitors as a function of states of said SIGN and M control signals and adjusting feedback loops associated with said first and second op amps as a function of states of said $\phi_1$ and $\phi_2$ clock signals, said first and second op amps generating a voltage difference at outputs thereof representing an analog equivalent of said digital number.

16. The converter as recited in claim 15 wherein said switching circuit having a plurality of transistor switches that selectively couple said positive and negative reference voltages to said inputs of said first and second op amps.

17. The converter as recited in claim 15 wherein said positive and negative reference voltages pass through matched sampling capacitors before being provided to said inputs of said first and second op amps.

18. The converter as recited in claim 15 wherein said conversion circuit includes matched pair of op amps.

19. The converter as recited in claim 15 wherein said feedback loops include matched integrating capacitors.

20. The converter as recited in claim 15 wherein said DAC converts said digital number to said analog equivalent in a single cycle of said input clock signal.

* * * * *